(12) United States Patent
Lee et al.

(10) Patent No.: US 12,518,674 B2
(45) Date of Patent: Jan. 6, 2026

(54) PRINTED CIRCUIT BOARD AND DISPLAY DEVICE HAVING THE SAME

(71) Applicant: Samsung Display Co., Ltd., Yongin-Si (KR)

(72) Inventors: Chong Guk Lee, Yongin-si (KR); Min Woo Kim, Yongin-si (KR); Jeong Mo Nam, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/772,266

(22) Filed: Jul. 15, 2024

(65) Prior Publication Data
US 2025/0140162 A1 May 1, 2025

(30) Foreign Application Priority Data
Nov. 1, 2023 (KR) .................. 10-2023-0149337

(51) Int. Cl.
*H05K 1/02* (2006.01)
*G09G 3/20* (2006.01)

(52) U.S. Cl.
CPC ....... *G09G 3/2096* (2013.01); *G09G 2370/08* (2013.01)

(58) Field of Classification Search
CPC ... H01C 1/14; H01C 1/40; H01C 7/10; G09G 3/00; G09G 3/20; G09G 3/32; G09G 3/36; G09G 3/2096; G09G 3/3225; G09G 5/00; G09G 2370/08; H05K 1/00; H05K 1/02; H05K 1/11; H05K 1/18; H05K 1/14; H05K 3/40; H05K 3/42; H05K 7/06; H05K 12/70; H05K 12/79; G02F 1/1345; H03H 7/38; H04N 3/27; H04N 5/38; H04N 5/50; H04N 5/66; H04N 5/268; H01P 1/00; H01P 3/02; H01P 5/04; H02J 3/14; G06F 3/038; H03K 19/173; H01L 21/82; G01R 27/32; H04L 25/03

See application file for complete search history.

(56) References Cited

U.S. PATENT DOCUMENTS

| | | | |
|---|---|---|---|
| 2016/0006102 A1* | 1/2016 | Park | H05K 1/0253 333/33 |
| 2018/0088386 A1* | 3/2018 | Enami | G09G 3/3648 |
| 2024/0321195 A1* | 9/2024 | Bao | G09G 3/3225 |

FOREIGN PATENT DOCUMENTS

| | | |
|---|---|---|
| JP | 2011-010209 A | 1/2011 |
| KR | 10-2008-0037468 A | 4/2008 |

* cited by examiner

*Primary Examiner* — Chanh D Nguyen
*Assistant Examiner* — Nguyen H Truong
(74) *Attorney, Agent, or Firm* — Innovation Counsel LLP

(57) ABSTRACT

A display device includes a display panel for displaying an image, a printed circuit board including a line unit, a timing controller for displaying the image on the display panel in response to signals received from the line unit, and a connector disposed on the printed circuit board. The line unit includes a first line pair adjacent to the connector, the first line pair including a first line and a second line, wherein the first line of the first line pair is spaced apart from the connector.

9 Claims, 5 Drawing Sheets

PRINTED CIRCUIT BOARD AND DISPLAY DEVICE HAVING THE SAME

CROSS-REFERENCE TO RELATED APPLICATION

The present application claims priority, under 35 U.S.C. § 119 (a), to Korean patent application No. 10-2023-0149337 filed on Nov. 1, 2023 in the Korean Intellectual Property Office, the entire disclosure of which is incorporated herein by reference.

BACKGROUND

1. Technical Field

The present disclosure generally relates to a printed circuit board and a display device having the same.

2. Related Art

With the development of information technologies, a display device that connects a user to information plays an increasingly important role. Accordingly, display devices such as a liquid crystal display device and an organic light emitting display device are used today more than ever before.

A display device is a device which visually displays data received from a host device. The display device may receive data from the host device through a connector. While a line inside the display device passes through the bottom of the connector, impedance is not uniformly maintained, and therefore, quality deterioration of signals may occur.

SUMMARY

Embodiments provide a printed circuit board and a display device having the same, in which impedance is maintained to avoid large fluctuations.

In accordance with an aspect of the present disclosure, there is provided a display device including: a display panel configured to display an image; a printed circuit board including a line unit; a timing controller configured to display the image on the display panel in response to signals received from the line unit; and a connector disposed on the printed circuit board, wherein the line unit includes a first line pair adjacent to the connector, the first line pair including a first line and a second line, and wherein the first line of the first line pair is spaced apart from the connector.

The first line of the first line pair may overlap with the connector, and the second line of the first line pair may not overlap with the connector.

Signals that are applied to the first line and the second line may be inverses of each other.

The line unit may further include a second line pair which is adjacent to the connector and is spaced apart from the first line pair, the second line pair including a third line and a fourth line. The third line of the second line pair may be spaced apart from the connector.

The third line of the second line pair may not overlap with the connector, and the fourth line of the second line pair may overlap with the connector.

The timing controller may be disposed on the printed circuit board.

In accordance with another aspect of the present disclosure, there is provided a display device including: a display panel configured to display an image; a timing controller configured to display the image on the display panel in response to an image signal; a printed circuit board including a line unit configured to transfer the image signal to the timing controller; and a connector disposed on the printed circuit board, the connector partially overlapping with the line unit that includes a first line pair, wherein one line of the first line pair of the line unit is spaced apart from the connector.

The connector may provide an image signal to the line unit on the printed circuit board.

A first line of the first line pair may overlap with the connector, and a second line of the first line pair may not overlap with the connector.

Signals that are applied to the first line and the second line may be inverses of each other.

The line unit may further include a second line pair positioned adjacent to the connector and spaced apart from the first line pair. The third line of the second line pair may be spaced apart from the connector.

The third line of the second line pair may not overlap with the connector, and the fourth line of the second line pair may overlap with the connector.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
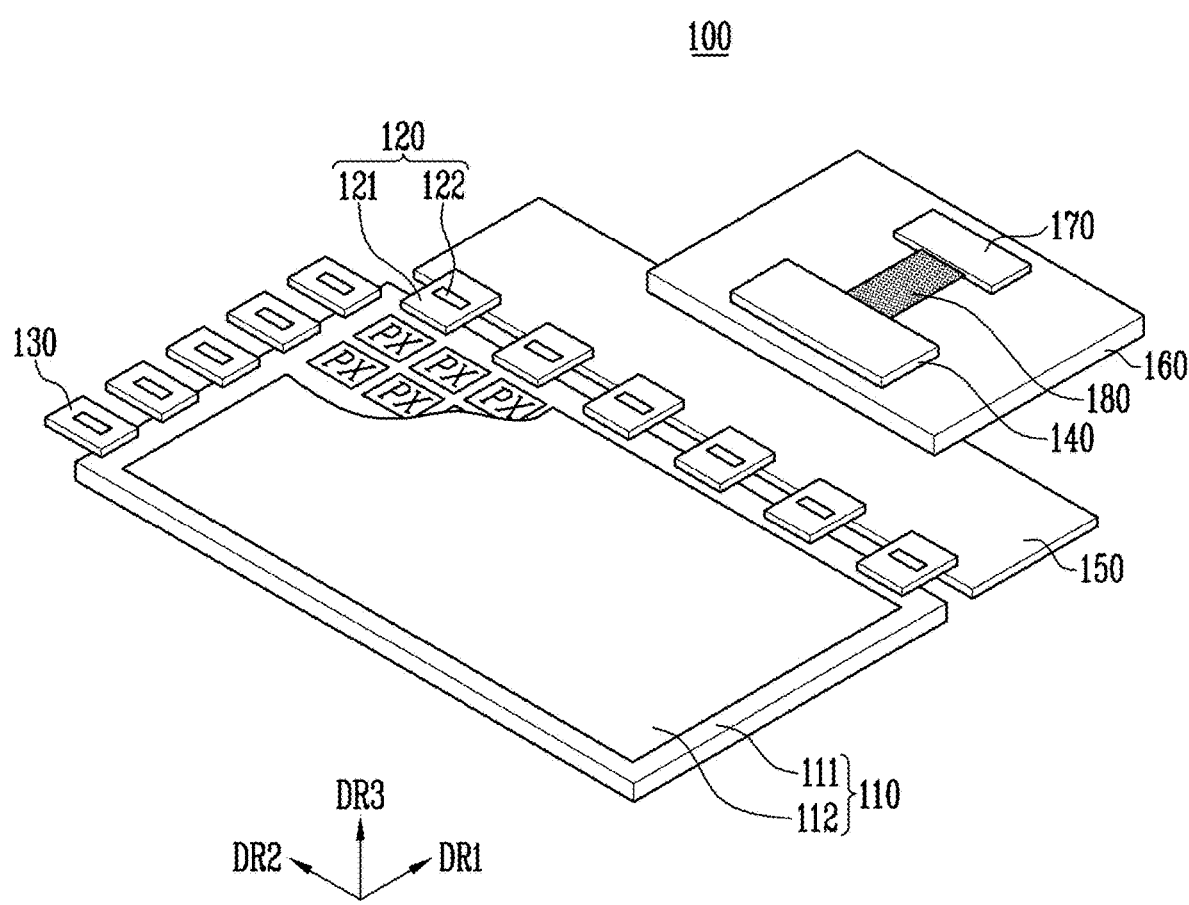
FIG. 1 is a schematic system configuration view of a display device in accordance with an embodiment of the present disclosure.

Hereinafter, exemplary embodiments are described in detail with reference to the accompanying drawings so that those skilled in the art may easily practice the present disclosure. The present disclosure may be implemented in various forms and is not limited to the exemplary embodiments described in the present specification.

Further, parts of the drawing that do not relate to the present disclosure have been omitted to clearly describe the present disclosure. Like parts are designated with like reference numerals throughout the specification.

Terms including "unit," "module," and the like, which are used herein, refer to units which perform at least one function or operation, and the unit, the module, and the like may be implemented as hardware, software, or a combination of hardware and software. Detailed descriptions of overlapping components will be omitted to clarify the scope of the present disclosure.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "in contact with" the other element but also a case where an additional element is interposed between the element and the other element. On the contrary, an expression that an element such as a layer, region, substrate or plate is placed "beneath" or "below" another element indicates not only a case where the element is placed "directly beneath" or "in contact with" the other element but also a case where an additional element is interposed between the element and the other element.

FIG. 1 is a schematic system configuration view of a display device in accordance with an embodiment of the present disclosure.

Referring to FIG. 1, the display device 100 in accordance with the embodiment of the present disclosure may include a display panel 110 in which a plurality of data lines and a plurality of scan lines are disposed, a plurality of data drivers 120 which output a data voltage to the plurality of data lines, a plurality of scan drivers 130 which output a scan signal to the plurality of scan lines, and a timing controller 140 which controls the plurality of data drivers 120 and the plurality of scan drivers 130.

The display panel 110 may include a plurality of pixels PX defined by the plurality of data lines and the plurality of scan lines. Circuit elements including a transistor may be disposed in each pixel PX area. Each pixel PX may be supplied with a data voltage through a data line, and be supplied with a scan signal through a scan line. The pixel PX may be configured with various types of circuit elements including at least one transistor, at least one capacitor, and the like. The number, kind, and the like of circuit elements in each pixel PX may vary according to a kind of the display device 100 and a pixel design manner.

Also, the display panel 110 may include a substrate 111 on which the plurality of data lines and the plurality of scan lines, and circuit elements including a transistor in each pixel PX area are disposed, and other components 112 on the substrate 111. The other components 112 may vary according to the type of display device 100 (e.g., an organic light emitting display device, a liquid crystal display device, a plasma display device, or the like).

Each of the plurality of data drivers 120 is a driver that drives a plurality of data lines disposed in the display panel 110. In an embodiment, each of the plurality of data drivers 120 may be implemented in a Chip On Film (COF) manner. That is, each of the plurality of data drivers 120 may be configured with a film 121 and a Data Driver IC (D-DIC) chip 122 mounted on the film 121. One side of each of the plurality of data drivers 120 may be connected to the display panel 110, and the other side of each of the plurality of data drivers 120 may be connected to a Data Printed Circuit Board (D-PCB) 150. The D-PCB 150 may be designated as a data board.

Meanwhile, in FIG. 1, it is illustrated that one D-PCB 150 is disposed in the display device 100. However, the scope of the present disclosure is not limited thereto, and a plurality of D-PCBs 150 may be disposed in the display device 100. That is, one side of the film 120 of each of the plurality of data drivers 120 may be connected to the display panel 110, and the other side of the film 120 of each of the plurality of data drivers 120 may be connected to the D-PCB 150.

Each of the plurality of scan drivers 130 is a driver which drives a plurality of scan lines disposed in the display panel 110. The plurality of scan drivers 130 may be connected to one side of the display panel 110 as shown in FIG. 1, or be connected to both sides of the display panel 110. Also, the plurality of scan drivers 130 may be provided in a form in which the plurality of scan drivers 130 are integrated on the display panel 110.

The timing controller 140 may be disposed on a Control Printed Circuit Board (C-PCB) 160. The C-PCB 160 may be designated as a control board. The timing controller 140 may not only output data to the plurality of data drivers 120 but also output various control signals to control operation timings of the plurality of data drivers 120 and the plurality of scan drivers 130. A Power Management IC (PMIC) and the like may be further disposed on the C-PCB 160.

A connector 170 may be disposed on the C-PCB 160. The connector 170 may connect the C-PCB 160 and a host device (not shown) to each other. The C-PCB 160 may be physically coupled to the host device through the connector 170. In other words, the connector 170 may be a fixing connector for fixing the C-PCB 160 and/or components thereof to an external device. In embodiments, the connector 170 may include a metal material.

The C-PCB 160 may include a line unit 180 for electrically connecting the timing controller 140 to the host device. The line unit 180 may include a plurality of line pairs. In an embodiment, each of the plurality of line pairs may include a p-type input/output line and an n-type input/output line, which are included in one channel having a differential signal manner.

On the C-PCB 160, the line unit 180 extending from the timing controller 140 may extend to an edge of the C-PCB 160 through the bottom of the connector 170. As such, the line unit 180 may overlap with the connector 170. When the C-PCB 160 is coupled to the host device, the input/output lines of the line unit 180 may be electrically connected to the signal lines of the host device.

In an embodiment, the timing controller 140 may receive an image signal and a control signal from the host device through the line unit 180. The timing controller 140 may control the plurality of data drivers 120 and the plurality of scan drivers 130 such that an image is displayed on the display panel 110 in response to the image signal and the control signal, which are received from the host device.

However, as a portion of the line unit 180 passes through the bottom of the connector 170, the impedance of the line unit 180 may not be maintained at a constant level. As the connector 170 includes the metal material, the impedance of a portion of the line unit 180 that overlaps with the connector 170 may be lower than the impedance of a portion of the line unit 180 that does not overlap with the connector 170.

As difference in impedance between the portion of the line unit 180 that overlaps with the connector 170 and the portion of the line unit 180 that does not overlap with the connector, becomes larger, quality deterioration of signals applied through the lines may occur.

Accordingly, to prevent the quality deterioration of signals, it is necessary to design the line unit 180 and/or the C-PCB 160 such that the difference in impedance between the portion of the line unit 180 that overlaps with the connector 170, and the portion of the line unit 180 that does not overlap with the connector, decreases.

FIG. 1 illustrates that the C-PCB 160 is disposed on the D-PCB 150. However, the present disclosure is not limited thereto, and the D-PCB 150 and the C-PCB 160 may be connected to each other through a cable such as a Flexible Flat Cable (FFC) or a Flexible Printed Circuit (FPC).

The timing controller 140, the PMIC, and the like, which are disposed on the C-PCB 160, may transmit/receive signals to/from the plurality of data drivers 120, the plurality of scan drivers 130, and the display panel 110 through the cable. The signals may include all electrical signals including various power sources (voltages and currents), control signals, sensing signals, data, and the like.

Figure 2:
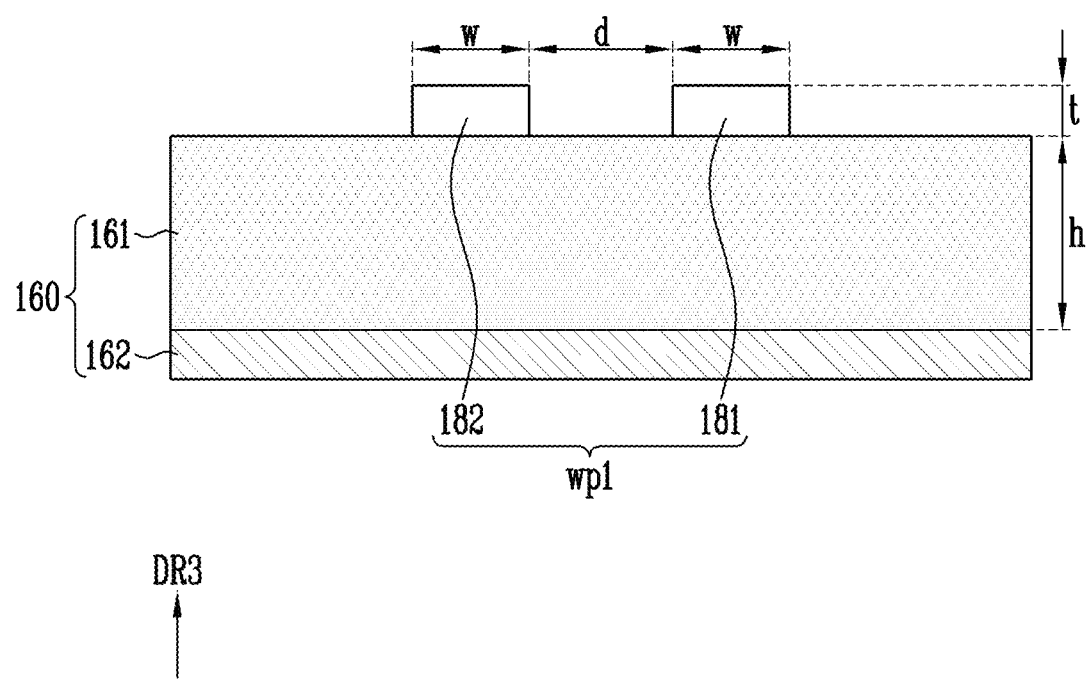
FIG. 2 is a sectional view of a control printed circuit board of the display device shown in FIG. 1.

FIG. 2 is a sectional view of the control printed circuit board of the display device shown in FIG. 1.

Referring to FIGS. 1 and 2, the control printed circuit board 160 may include an insulating layer 161 and a ground portion 162, and the line unit 180 may be disposed on the insulating layer 161. A first line pair wp1 among the plurality of line pairs of the line unit 180 may include a first line 181 and a second line 182.

In an embodiment, signals that are inverses of each other may be applied to the first line 181 and the second line 182, which form the first line pair wp1. For example, a first signal may be applied to the first line 181, an inverse signal of the first signal, i.e., a second signal as a differential signal may be applied to the second line 182. The first line 181 may be a p-type input/output line, and the second line 182 may be an n-type input/output line.

Each of the first line 181 and the second line 182 may have a reference width w. Each of the first line 181 and the second line 182 may have a reference height t. The first line 181 and the second line 182 may be separated by a reference distance d. The reference width w, the reference height t, and the reference distance d may be freely set according to a design of the line unit 180.

The insulating layer 161 may have a dielectric constant. The ground portion 162 may provide a ground to the plurality of line pairs of the line unit 180.

Impedance of the first line 181 and the second line 182 may vary with the reference width w, the reference height t, and a dielectric constant of a medium constituting the insulating layer 161. However, the first line 181 and the second line 182 pass across the bottom of the connector 170 shown in FIG. 1, and the impedance of the first line 181 and the second line 182 may be changed by the presence of metal in the connector 170. Accordingly, the impedance of the first line 181 and the second line 182 may be dramatically changed between an external area of the connector 170 and an area at the bottom of the connector 170.

Figure 3:
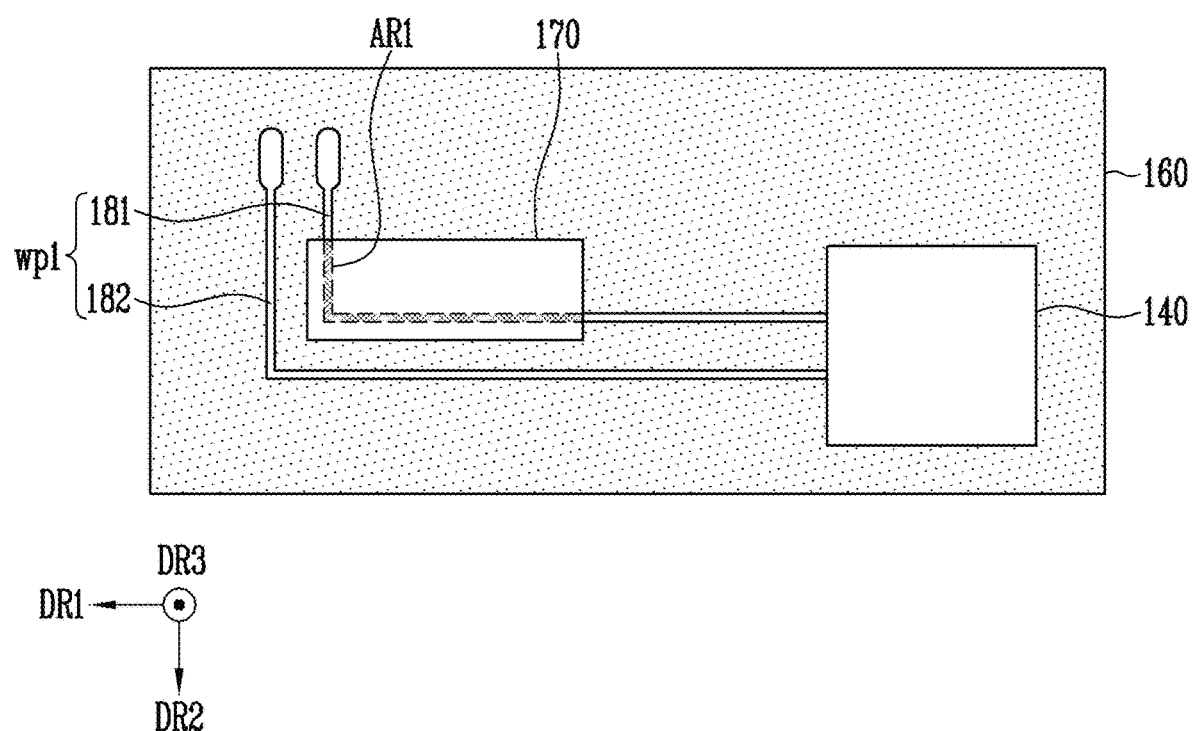
FIG. 3 is a plan view illustrating an embodiment of the control printed circuit board of the display device shown in FIG. 1.

FIG. 3 is a plan view illustrating an embodiment of the control printed circuit board of the display device shown in FIG. 1. Referring to FIGS. 1 and 3, a timing controller 140, a connector 170, and a first line pair wp1, which are disposed on the control printed circuit board 160, are illustrated. For simplification of the drawing, portions irrelevant to the present disclosure will be omitted.

Descriptions of the timing controller 140 and the connector 170 shown in FIG. 3 may be similar to the descriptions of the timing controller 140 and the connector 170 shown in FIG. 1. Any redundant descriptions will be simplified or omitted.

A first line 181 of the first line pair wp1 may be partially disposed on the bottom surface of the connector 170, and a second line 182 of the first line pair wp1 may be spaced apart from the outer surfaces of the connector 170. The second line 182 is adjacent to the connector 170 but may not overlap with the connector 170. In this disclosure, the first line pair wp1 is described as being "adjacent to" the connector 170 to indicate proximity to the connector 170 without limiting it to a specific position. In the embodiment shown, both the first line 181 and the second line 182 have a bend to form an angle that matches an outline of the connector 170; however, this is not a limitation of the disclosure.

A portion of the first line 181, that is designated as a first area AR1 may overlap with the connector 170. As the first line 181 may overlap with the connector 170 and the second line 182 does not overlap with the connector 170. when inverse signals are transmitted in the first line 181 and the second line 182, the impedance difference between the first line 181 of the first line pair wp1 that overlaps with the connector 170 and the second line 182 of the first line pair wp1 that does not overlap with the connector 170 can decrease.

In addition, since the second line 182 is spaced apart from the connector 170, the second line 182 in addition to the first line 181 can be stably connected to a corresponding signal line of the host device when the controller printed circuit board 160 is fixed to the host device through the connector 170.

With the arrangement of the disclosure, the impedance of the line unit 180 does not dramatically change according to the position of the lines of the line unit 180, but may change within a predetermined error range. Accordingly, quality deterioration of signals passing through the line unit 180 is reduced or avoided, and an image can be displayed on the display panel with noise.

FIG. 3 illustrates that the first line 181 of the first line pair wp1 is partially disposed on the bottom surface of the connector 170. However, the present disclosure is not limited thereto, and the second line 182 of the first line pair wp1 may be disposed on the bottom of the connector 170. That is, either one of the first line 181 and the second line 182 of the first line pair wp1 may be disposed to pass through the bottom of the connector 170.

Figure 4:
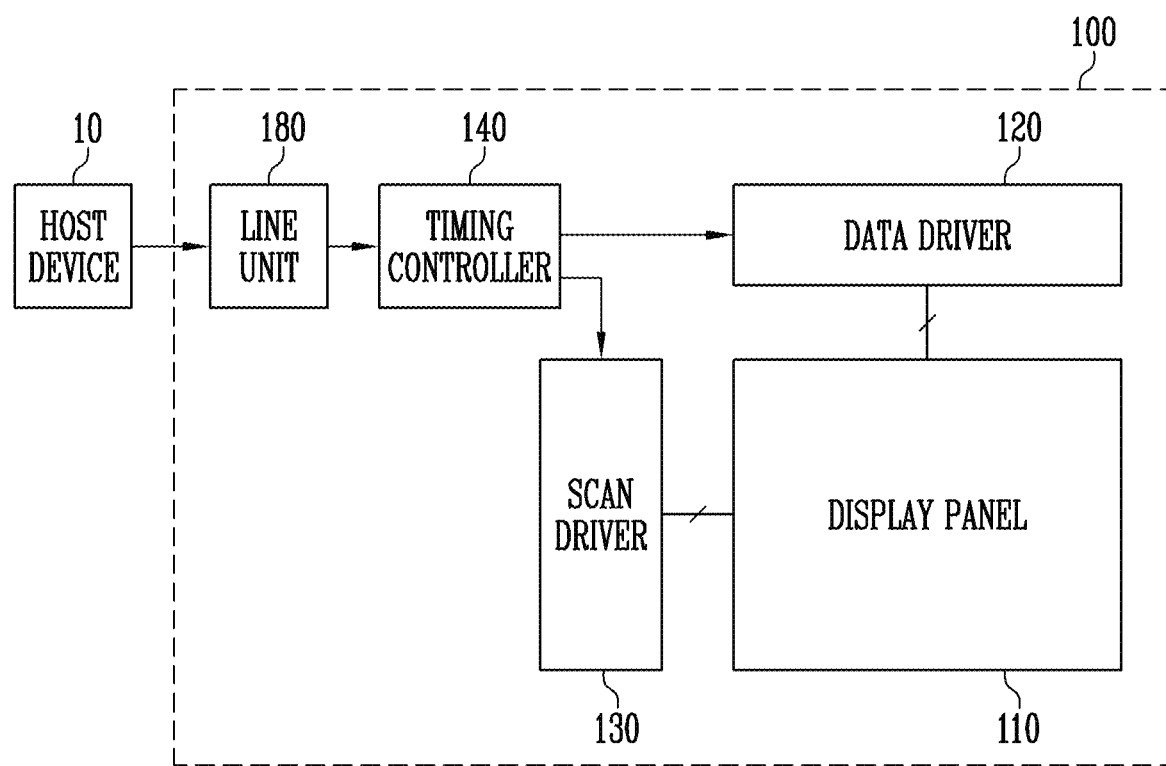
FIG. 4 is a block diagram illustrating a circuit configuration of the display device shown in FIG. 1.

FIG. 4 is a block diagram illustrating a circuit configuration of the display device shown in FIG. 1.

Referring to FIG. 4, a display device 100 may include a display panel 110, a data driver 120, a scan driver 130, a timing controller 140, and a line unit 180. The display device 100 may communicate with the host device 10 through the line unit 180. Description for the display device 100 shown in FIG. 4 may be similar to the description of the display device 100 shown in FIG. 1, and will not be repeated.

The host device 10 may transmit an image signal and a control signal to the timing controller 140 through the line unit 180. The timing controller 140 may control the data driver 120 and the scan driver 130 such that an image is displayed on the display panel 110, based on the image signal and the control signal that are received from the host device 10.

When the image signal and the control signal are distorted in the process of being transferred from the connector 170 to the timing controller 140, the image intended by the host device 10 may not be displayed on the display panel 110.

Accordingly, it is necessary to design input/output lines of the line unit 180 such that the image signal and the control signal, which are transferred to the timing controller 140 through the line unit 180, are not distorted.

Figure 5:
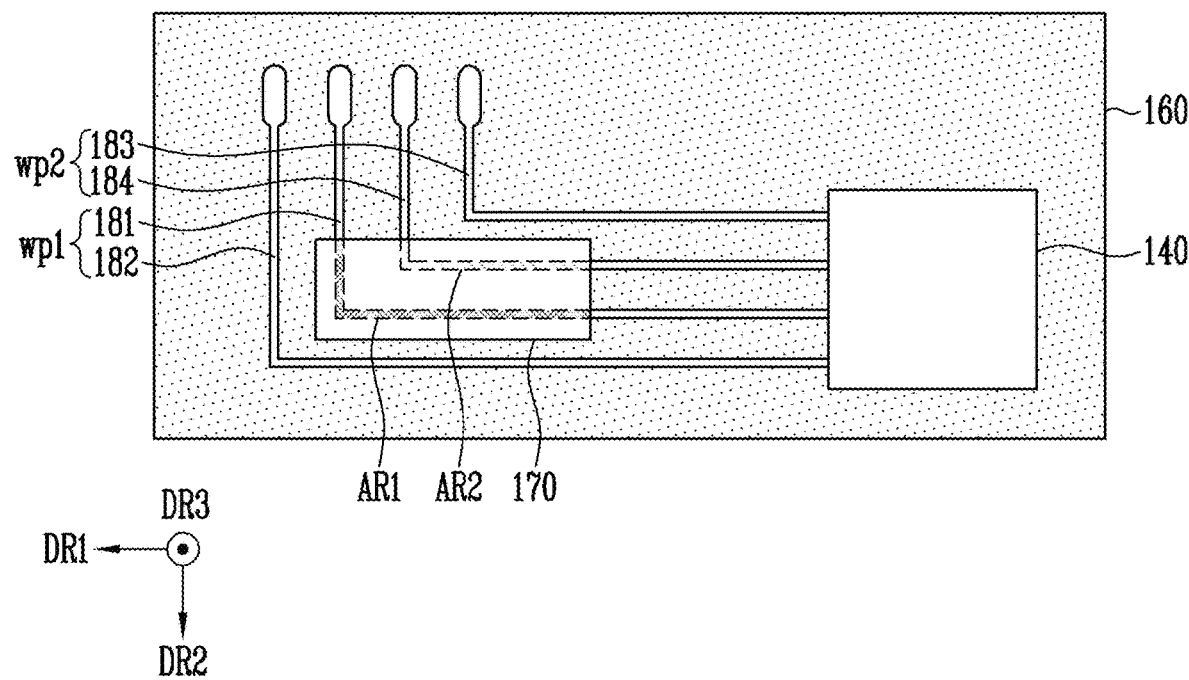
FIG. 5 is a plan view illustrating an embodiment of the control printed circuit board of the display device shown in FIG. 1.

FIG. 5 is a plan view illustrating an embodiment of the control printed circuit board of the display device shown in FIG. 1. Referring to FIGS. 1 and 5, a timing controller 140, a connector 170, a first line pair wp1 and a second line pair wp2, which are disposed on the control printed circuit board 160, are illustrated. For simplification of the drawing, portions irrelevant to the present disclosure will be omitted for the purpose of clear description of the present disclosure.

Descriptions of the timing controller 140 and the connector 170 shown in FIG. 5 may be similar to the descriptions of the timing controller 140 and the connector 170 shown in FIG. 1, and will not be repeated. In addition, the first line pair wp1 shown in FIG. 5 may be described similarly to the first line pair wp1 shown in FIG. 2, and overlapping descriptions will be simplified or omitted.

The second line pair wp2 of the plurality of line pairs of the line unit 180 may include a third line 183 and a fourth line 184.

In an embodiment, signals inverted with respect to each other may be applied to the third line 183 and the fourth line 184, which form the second line pair wp2. The first line 181 may be a p-type input/output line, and the second line 182 may be an n-type input/output line. The third line 183 may be a p-type input/output line, and the fourth line 184 may be an n-type input/output line. The third line 183 and the fourth line 184 may have a structure similar to the structure of the first line 181 and the second line 182.

The first line 181 of the first line pair wp1 and the fourth line 184 of the second line pair wp2 may be disposed on the bottom surface of the connector 170, and the second line 182 of the first line pair wp1 and the third line 183 of the second line pair wp2 may be disposed next to the connector 170. The second line 182 and the third line 183 are adjacent to the connector 170 and may not overlap with the connector 170.

More specifically, the second line 182 of the first line pair wp1, which is the n-type input/output line, and the third line 183 of the second line pair wp2, which is the p-type input/output line, may be spaced apart from the connector 170. The first line 181 of the first line pair wp1, which is the p-type input/output line, and the fourth line 184 of the second line pair wp2, which is the n-type input/output line, may be disposed on the bottom surface of the connector 170.

A portion of the first line 181 that is designated as "a first area AR1" may overlap with the connector 170. A portion of the fourth line 184 that is designated as "a second area AR2" may overlap with the connector 170. As such, as the first line 181 and the fourth line 184 overlap with the connector 170 and the second line 182 and the third line 183 do not overlap with the connector 170, an impedance difference between portions of the first line pair wp1 and the second line pair wp2 that overlap with (or are adjacent to) the connector 170, and portions of the first line pair wp1 and the second line pair wp2 that do not overlap with the connector 170, can decrease.

In addition, since the second line 182 and the third line 183 are adjacent to the connector 170, the second line 182 and the third line 183 in addition to the first line 181 and the fourth line 184 can be stably connected to corresponding signal lines of the host device when the control printed circuit board 160 is fixed to the host device through the connector 170.

With the arrangement of this disclosure, the impedance of the line unit 180 does not dramatically change according to the position of the lines of the line unit 180, but may change within a predetermined error range. Accordingly, quality deterioration of signals passing through the line unit 180 may be reduced or avoided, and an image can be displayed on the display panel with noise.

In the printed circuit board and the display device having the same in accordance with the present disclosure, the impedance of the line unit is maintained at a constant level, thereby preventing quality deterioration of signals.

Example embodiments have been disclosed herein, and although specific terms are employed, they are used and are to be interpreted in a generic and descriptive sense only and not to limit the scope of the disclosure. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
   a display panel configured to display an image;
   a printed circuit board including a line unit;
   a timing controller configured to display the image on the display panel in response to signals received from the line unit; and
   a connector disposed on the printed circuit board,
   wherein the line unit includes a first line pair including a first line and a second line, the line unit being adjacent to the connector,
   wherein the first line of the first line pair is spaced apart from the connector,
   wherein the line unit further includes a second line pair positioned adjacent to the connector and spaced apart from the first line pair, the second line pair including a third line and a fourth line,
   wherein the third line of the second line pair is disposed at the outside of the connector, and
   wherein the third line of the second line pair does not overlap with the connector, and the fourth line of the second line pair overlaps with the connector.

2. The display device of claim 1, wherein the first line of the first line pair overlaps with the connector, and the second line of the first line pair does not overlap with the connector.

3. The display device of claim 2, wherein signals applied to the first line and the second line are inverses of each other.

4. The display device of claim 1, wherein the timing controller is disposed on the printed circuit board.

5. An electronic device including the display device of claim 1.

6. A display device comprising:
   a display panel configured to display an image;
   a timing controller configured to display the image on the display panel in response to an image signal;
   a printed circuit board including a line unit configured to transfer the image signal to the timing controller; and
   a connector disposed on the printed circuit board, the connector partially overlapping with the line unit that includes a first line pair,
   wherein one line of the first line pair is spaced apart from the connector, and
   wherein the connector provides an image signal to the line unit on the printed circuit board.

7. The display device of claim 6, wherein a first line of the first line pair overlaps with the connector, and a second line of the first line pair does not overlap with the connector.

8. The display device of claim 7, wherein signals that are applied to the first line and the second line are inverses of each other.

9. A display device comprising:
a display panel configured to display an image;
a timing controller configured to display the image on the display panel in response to an image signal;
a printed circuit board including a line unit configured to transfer the image signal to the timing controller; and
a connector disposed on the printed circuit board, the connector partially overlapping with the line unit that includes a first line pair;
wherein one line of the first line pair is spaced apart from the connector,
wherein the line unit further includes a second line pair positioned adjacent to the connector and spaced apart from the first line pair, the second line pair including a third line and a fourth line,
wherein the third line of the second line pair is spaced apart from the connector, and
wherein the third line of the second line pair does not overlap with the connector, and the fourth line of the second line pair overlaps with the connector.

\* \* \* \* \*